United States Patent [19]

Domenichini et al.

[11] Patent Number: 5,256,977
[45] Date of Patent: Oct. 26, 1993

[54] HIGH FREQUENCY SURGE TESTER METHODS AND APPARATUS

[75] Inventors: Carlo Domenichini, Siena; Massimo Linari, Tavarnelle Val di Pesa, both of Italy

[73] Assignee: Axis USA, Inc., Marlborough, Mass.

[21] Appl. No.: 796,643

[22] Filed: Nov. 22, 1991

[51] Int. Cl.⁵ .............................. G01R 31/02
[52] U.S. Cl. .................. 324/546; 324/536; 324/520; 324/545; 324/726
[58] Field of Search ............ 324/520, 536, 546, 547, 324/557, 158 MG, 726, 655; 340/647, 646; 29/605

[56] References Cited

U.S. PATENT DOCUMENTS

| | | | |
|---|---|---|---|
| 2,996,664 | 8/1961 | Vogel | 324/536 |
| 3,173,086 | 3/1965 | Kresge | 324/520 |
| 4,006,410 | 2/1977 | Roberts | 324/520 |
| 4,356,443 | 10/1982 | Emery | 324/520 |
| 4,651,086 | 3/1987 | Domenichini et al. | |
| 4,779,051 | 10/1988 | Grunewald | 324/536 |

FOREIGN PATENT DOCUMENTS

0415370 3/1991 European Pat. Off.
9010241 9/1990 PCT Int'l Appl.
0932430 5/1982 U.S.S.R. ............ 324/520
955031 2/1983 U.S.S.R.

OTHER PUBLICATIONS

Rylander: "Testing Insulation with High Frequency", Electric Journal—Jan., 1928.
K.-H. Linsel et al., "Diagnose von Isloierungsfehlern in Wicklungen elektrischer Maschinen", Elektrie, vol. 42, No. 5, May 1989, Berlin, West Germany, pp. 177-179.

Primary Examiner—Kenneth A. Wieder
Assistant Examiner—Jose M. Solis
Attorney, Agent, or Firm—Robert R. Jackson; Robert W. Morris

[57] ABSTRACT

A high frequency surge tester includes a high frequency detection circuit which is used to detect microfracture defects in the insulation of wire on wound coils. The high frequency detection circuit includes a high-pass filter which isolates an errant voltage response so that it can be integrated and compared to threshold limits to determine the magnitude of defects. The surge tester also detects shorts between coils and shorts between turns of the same coil.

19 Claims, 8 Drawing Sheets

HIGH FREQUENCY SURGE TESTER METHODS AND APPARATUS

BACKGROUND OF THE INVENTION

This invention relates to the testing of electric components having wound coils, and more particularly, to the use of a device which supplies a high frequency surge to test wound coils for such defects as shorts between coils, shorts between turns of the same coil, and defects found in the wires that form coils.

The manufacturing process for wound coil devices typically has many quality control steps to ensure that a satisfactory product is produced. One well known procedure for determining various defects in wound coils is called the "surge test". It is frequently desired that this test be conducted rapidly, but with precision, on each coil of a particular device to determine the overall quality of the device (e.g. coils of an armature connected to the bars of a commutator or coils of a stator connected to the terminals of an end mold).

Heretofore, the surge test has only had the capability to determine defects such as a short between coils in a winding or a short between turns on the same coil. If a defect has been introduced into the wire as part of the manufacturing process, such as a microfracture in the insulation material, it will not be found by the current surge test. Such defects can lead to precocious degradation of the coil and should be identified before incorporation into the final product.

In view of the foregoing, it is an object of this invention to provide an improved surge test to identify additional defects which can occur during the manufacturing of wound coil devices.

SUMMARY OF THE INVENTION

This and other objects of the invention are accomplished in accordance with the principles of the invention by providing an improved surge tester with the capability to detect microfracture defects in the wire of coil windings, as well as the more traditional defects (e.g., shorts between coils and/or shorts between turns of the same coil) related to the coil manufacturing process. A high frequency detection circuit having a high-pass filter, an amplifier, a rectifier, and an integrator are included in the surge tester. This additional circuitry is used to isolate and precisely measure the response generated by defects within the wire of coil windings. In this manner, microfracture defects, as well as traditional defects, can be detected within coil windings.

Further features of the invention, its nature and various advantages will be more apparent from the accompanying drawings and the following detailed description of the preferred embodiments.

BRIEF DESCRIPTION OF THE DRAWINGS

FIG. 1 is a graph displaying voltage versus time of the main response, generated by a perfect wound coil in the tester of FIG. 1.

DETAILED DESCRIPTION OF THE PREFERRED EMBODIMENTS

Figure 1:
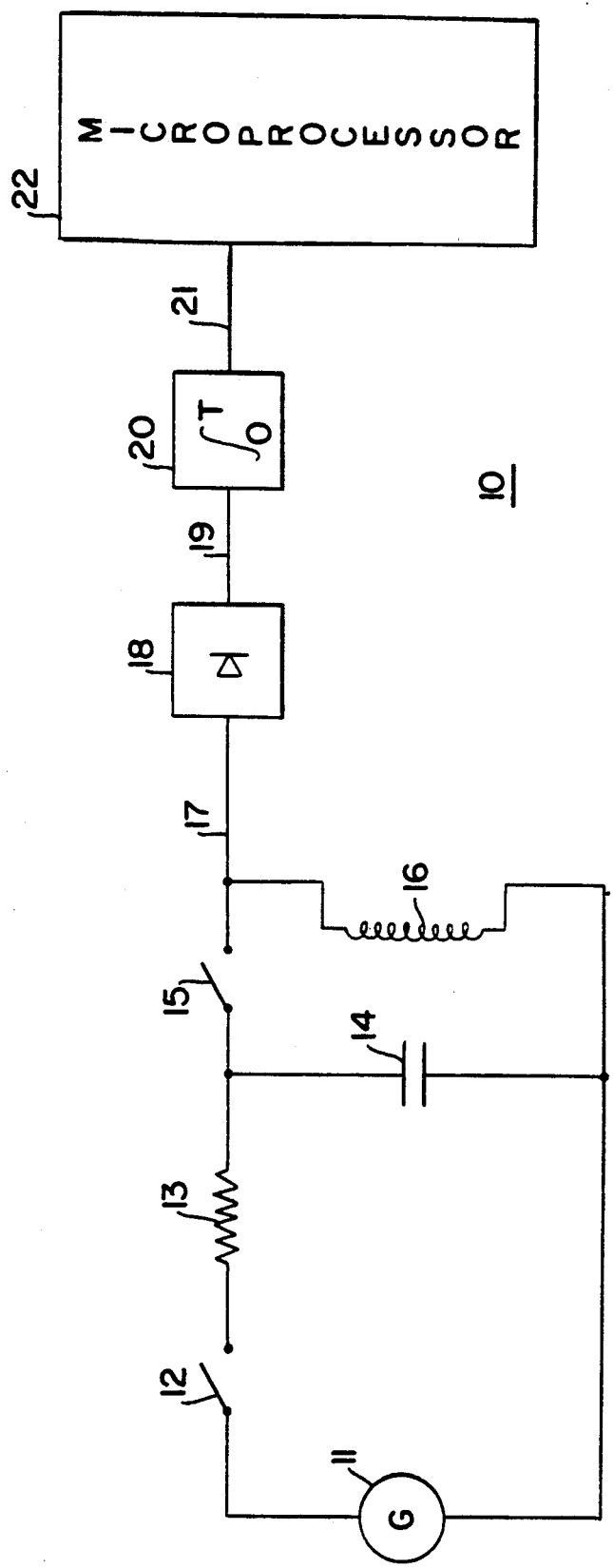
FIG. 1 is a schematic block diagram of prior art tester apparatus.

As shown in FIG. 1, a typical prior art surge tester 10 includes predetermined voltage source 11, switches 12 and 15, resistor 13, capacitor 14, full wave rectifier 18, integrator 20, and microprocessor 22. During normal testing of wound coil 16, switch 12 is closed to provide a path from predetermined voltage source 11 through resistor 13 to charge capacitor 14 with a required amount of energy. Once capacitor 14 has been sufficiently charged, switch 12 is opened and switch 15 is closed. This causes a damped oscillatory discharge of the energy stored in capacitor 14 via the RLC circuit comprising capacitor 14 and wound coil 16 (which provides both inductance L and resistance R). This discharge is monitored by the signal which travels along path 17 to rectifier 18, then along path 19 to integrator 20, before flowing along path 21 to microprocessor 22.

Figure 2:
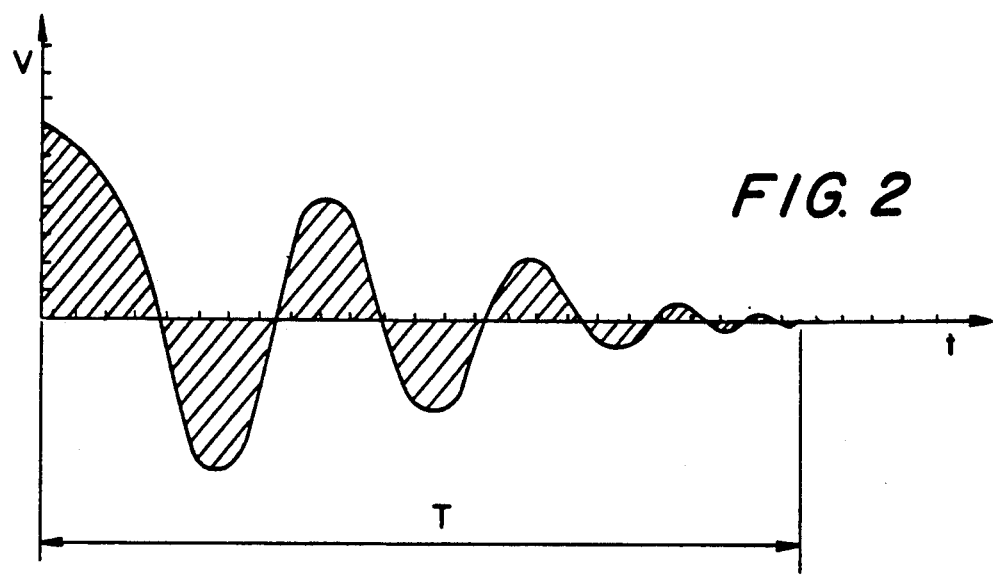
Figure 3:
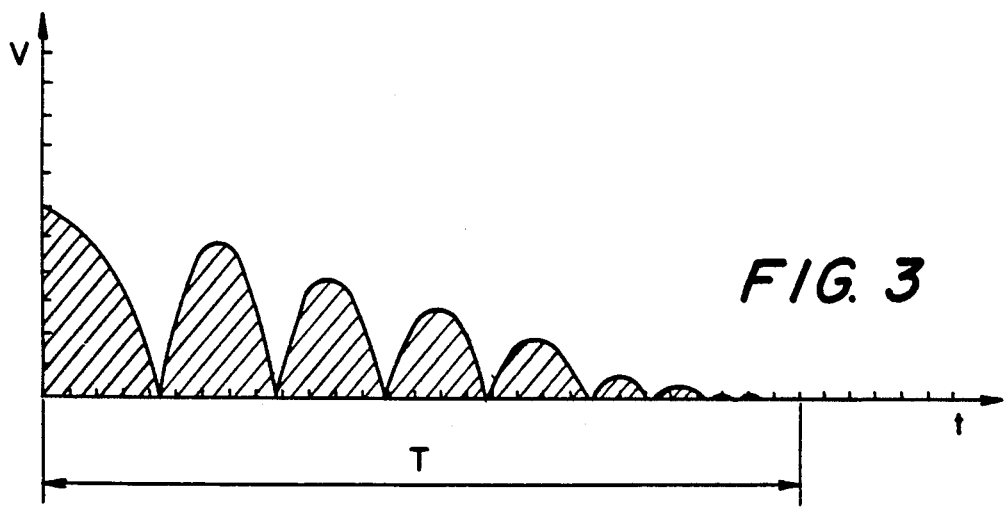
FIG. 3 is a graph displaying the same signal as FIG. 2 after it has passed through a full wave rectifying circuit.
Figure 4:
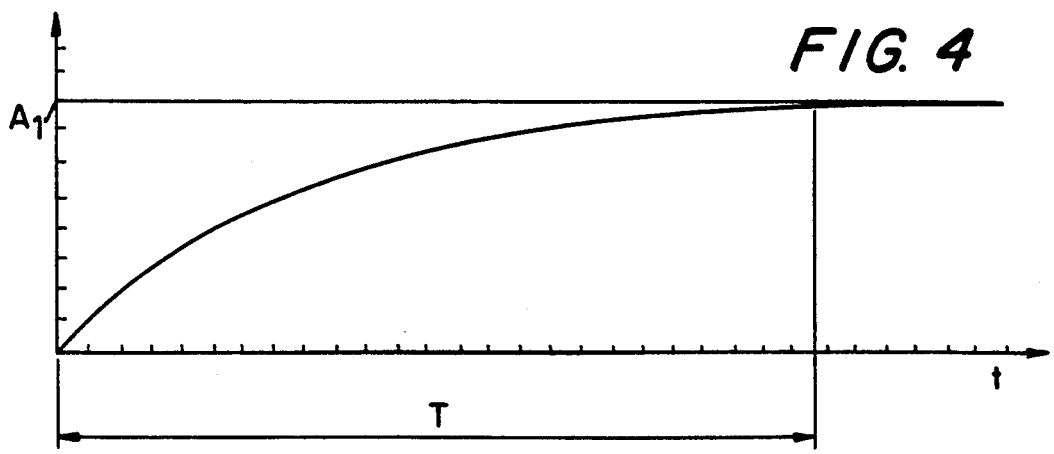
FIG. 4 is a graph displaying the approximate integration of the signal of FIG. 3.

FIG. 2 is a graph showing the voltage response of wound coil 16 seen at path 17 during the discharge of capacitor 14, assuming a perfect wound coil. FIG. 3 is a graph showing the same signal at path 19 after it has been rectified by rectifier 18. FIG. 4 is a graph which shows the same signal at path 21 after it has been integrated by integrator 20. Microprocessor 22 receives the analog signal and converts it to a digital signal using an internal analog-to-digital (A/D) converter.

Figure 5:
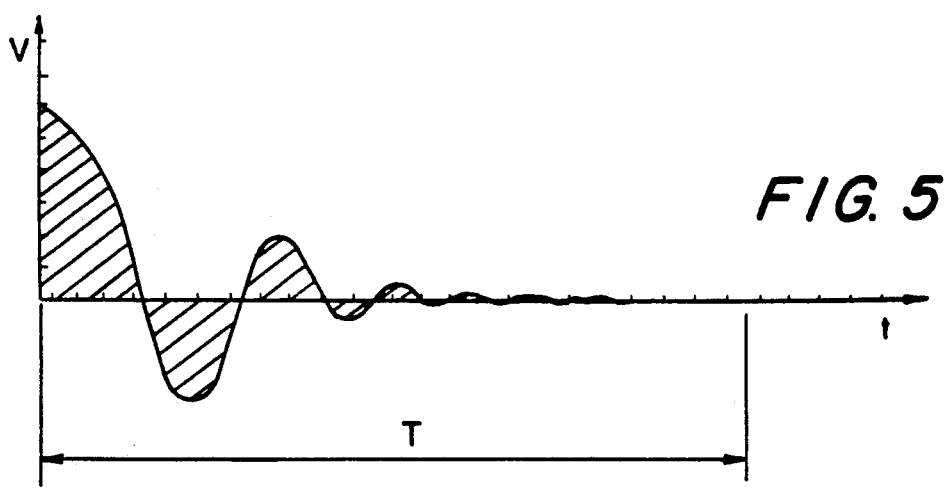
FIG. 5 is a graph displaying voltage versus time of the main response generated by a wound coil with a defect in the tester of FIG. 1.
Figure 6:
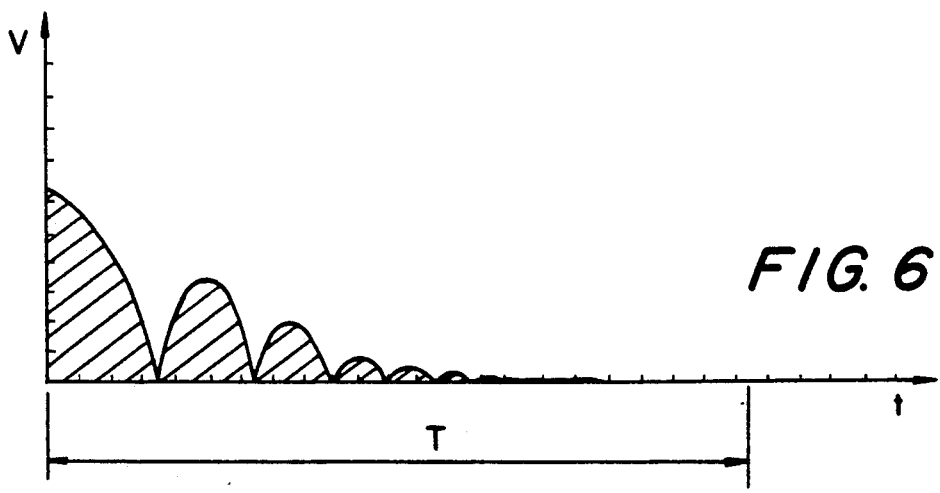
FIG. 6 is a graph displaying the same signal as FIG. 5 after it has passed through a full wave rectifying circuit.
Figure 7:
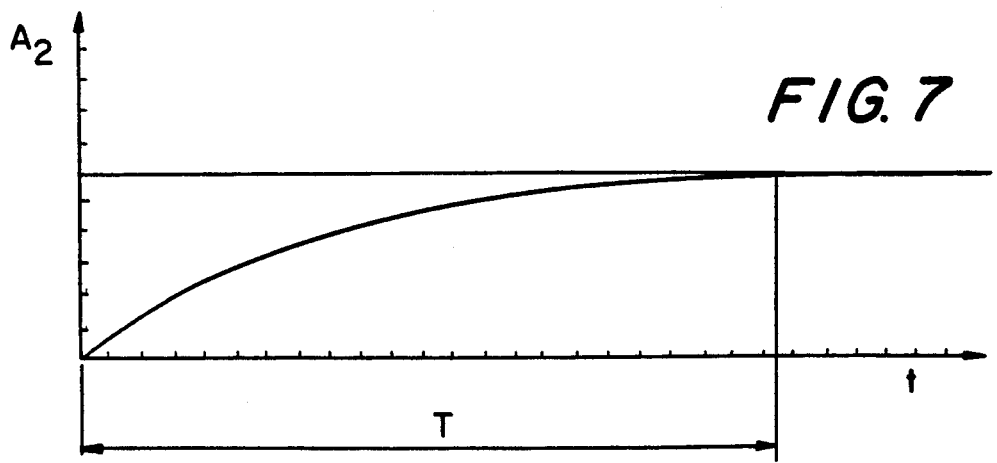
FIG. 7 is a graph displaying the approximate integration of the signal of FIG. 6.

FIGS. 5, 6, and 7 are respectively similar to FIGS. 2, 3, and 4, but show the voltage response of a wound coil containing defects of the kind which are detectable by the apparatus of FIG. 1. Note the lower amplitude and the decreased time required for the discharge signal to approach zero in FIGS. 5 and 6 as compared to the signal in FIGS. 2 and 3. In FIGS. 2, 3, 5, and 6, time 0 represents the time when the discharge voltage has reached a maximum value. Microprocessor 22 compares the final amplitude of the signal in FIG. 7 to predetermined upper and lower threshold limits, which are based upon the signal in FIG. 4, to determine the presence and magnitude of traditionally detectable defects. The wound coil being tested can therefore be classified accordingly.

An alternative embodiment of prior art exists for determining the presence of traditionally detectable defects, whereby a voltage source is connected directly to a wound coil being tested. From a precise instant when current circulating in the wound coil has reached a predetermined value, the current from the voltage source is interrupted and the corresponding output signal across the wound coil is measured for a peak value. This peak value is then compared to preexisting threshold values to determine the presence of defects in the wound coil. Due to the fact that there is less data to analyze using this test procedure (peak value versus complete output signal), this method may be somewhat less precise than the foregoing procedure.

The present invention is an improvement on the first prior art described above, which can determine the presence of additional defects in wound coils. These additional defects, which cannot be found using any of the prior art above, typically comprise microfractures in the insulation material which covers the main conductor of the wound coil. The extent and quantity of microfractures can increase during the winding operation, due to the periodic impact of the wire against the guide members which place the wire in the correct position on the coil. The microfractures can expose the main conductor to ambient gases within the final appliance. During normal functioning of the wound coil, discharge can occur from the exposed main conductor which can cause ionization of the ambient gases. Although this phenomenon is not fully understood by the wire manufacturers, analysis has shown that an excessive amount of such defects can lead to precocious degradation of the wound coil.

Figure 8:
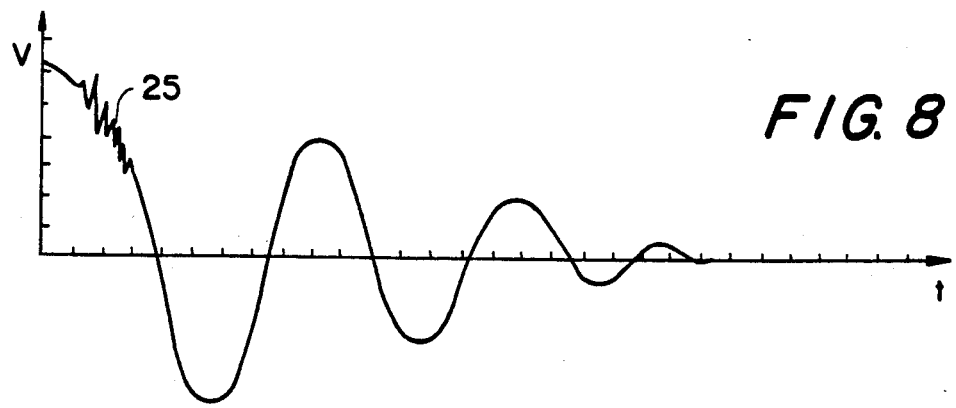
FIG. 8 is a graph displaying voltage versus time showing the response of a microfractured wire within the main response generated by an otherwise perfect wound coil.

A detailed analysis of the voltage response of surge tester 10 has revealed the presence of an additional response 25 within the main response (especially the higher voltage portions of the main response) when microfractures are present, as shown in FIG. 8. Response 25 typically has a frequency between 1–10 MHz versus 10–150 KHz for a typical main response. These frequencies tend to vary within the given ranges depending on the characteristics of the wound coil being tested. In order to detect the presence and magnitude of response 25, further analysis capability is added to the surge tester in accordance with the present invention.

Figure 9:
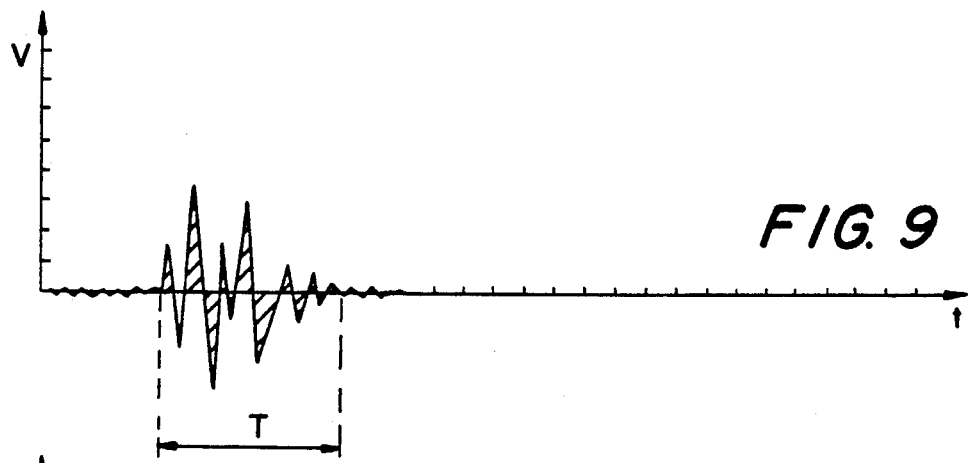
FIG. 9 is a graph displaying voltage versus time of the response of FIG. 8 with the high frequency portion of that response isolated in accordance with this invention. (The time base of FIGS. 9-11 is different from the time base of FIGS. 2-8.)
Figure 10:
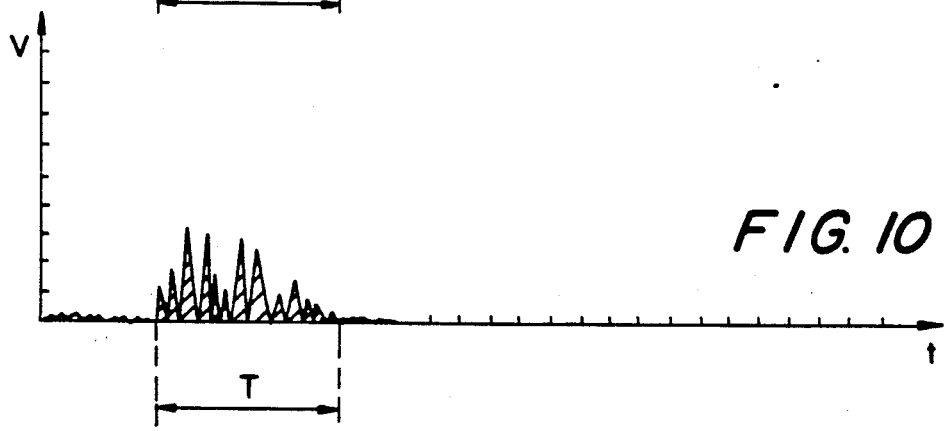
FIG. 10 is a graph displaying the same signal as FIG. 9 after it has passed through a full wave rectifying circuit in accordance with this invention.
Figure 11:
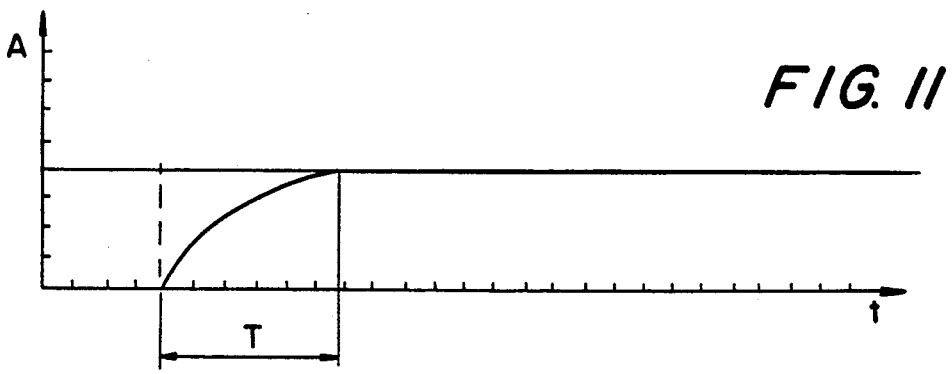
FIG. 11 is a graph displaying the approximate integration of the signal of FIG. 10 in accordance with this invention.
Figure 12:
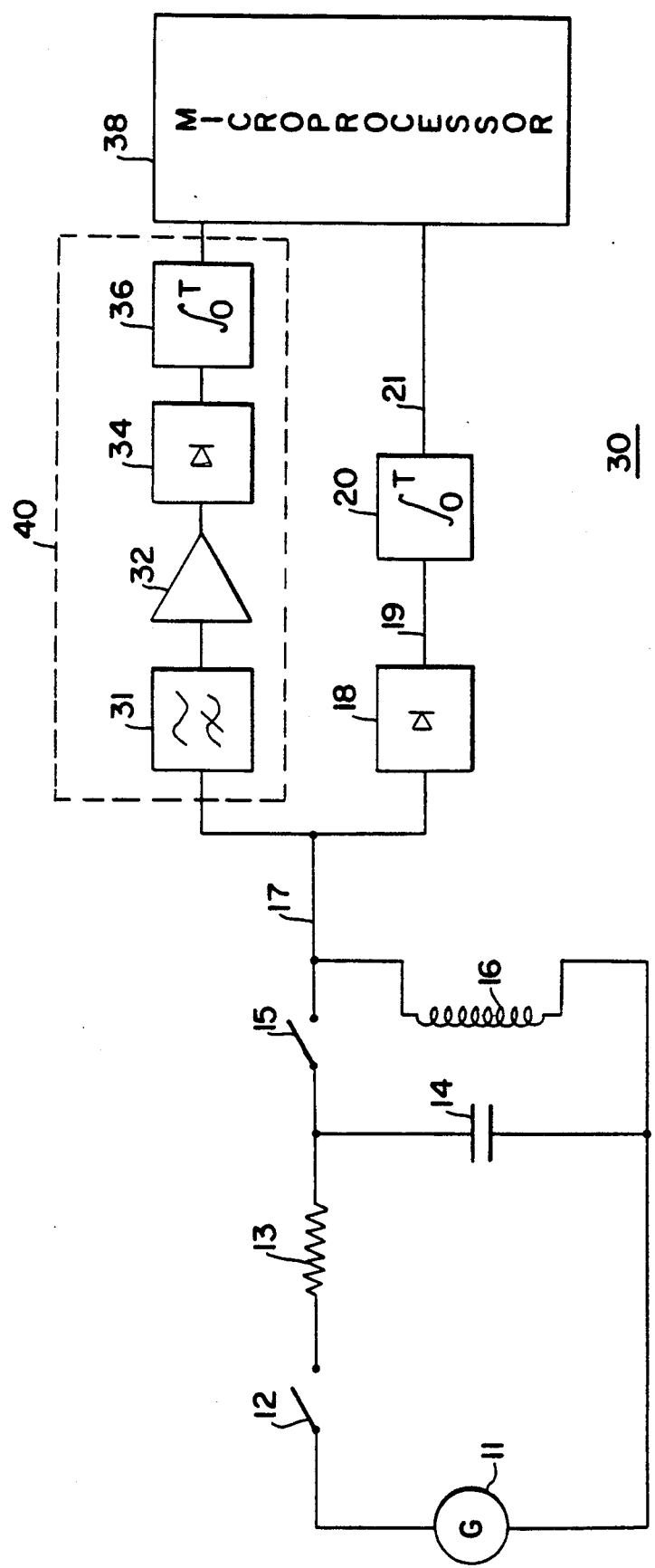
FIG. 12 is a schematic block diagram showing an illustrative embodiment of tester apparatus constructed in accordance with the principles of this invention.
Figure 13:
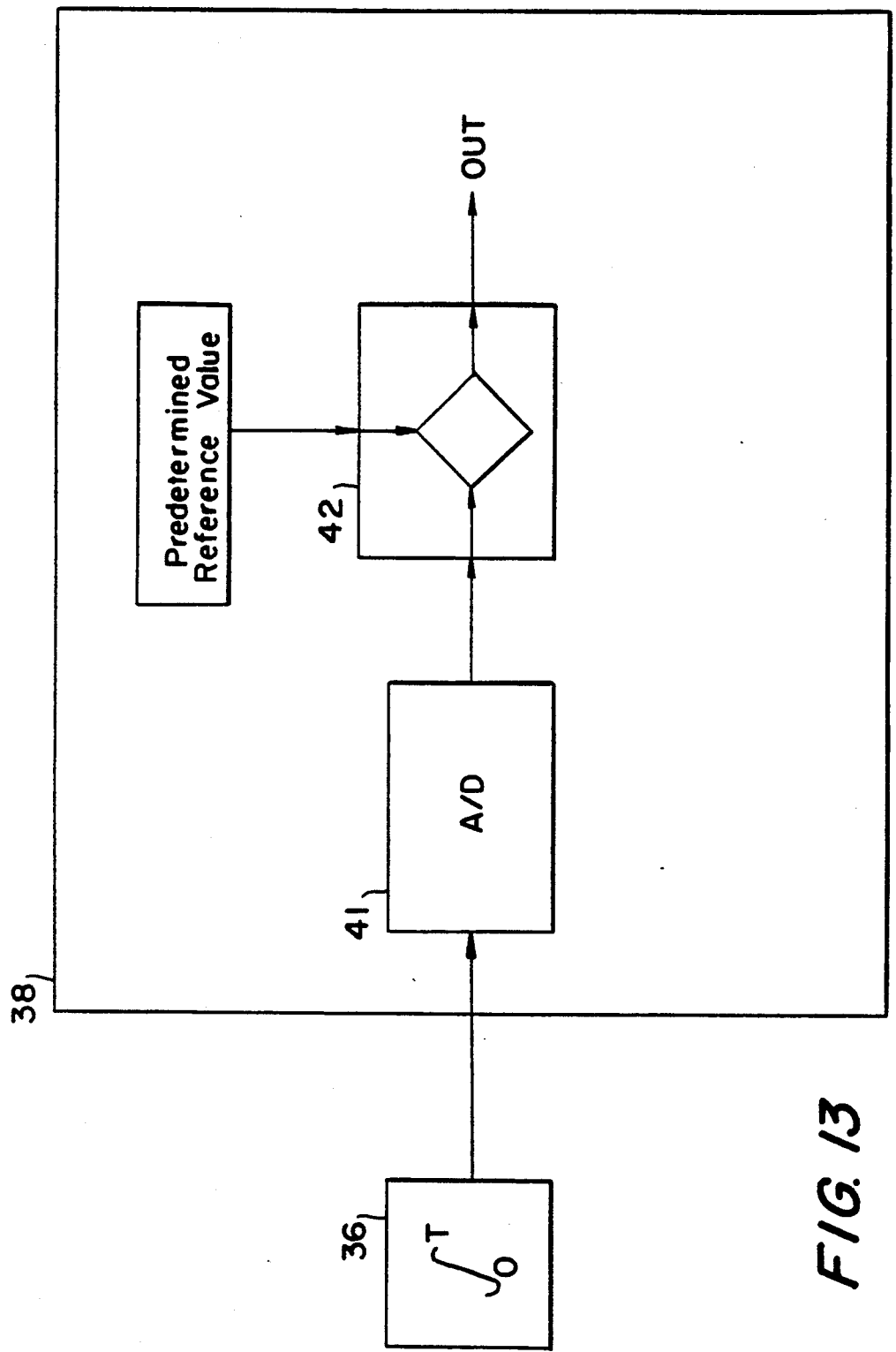
FIG. 13 is a block diagram showing partial operation of the microprocessor in FIG. 12.

As shown in FIG. 12, the improved surge tester 30 of this invention includes all of the circuitry of surge tester 10, with the addition of high-pass filter 31, amplifier 32, full wave rectifier 34, integrator 36, and improved (or at least reprogrammed) microprocessor 38 (which replaces microprocessor 22). Surge tester 30 detects traditionally detectable defects in the same manner as surge tester 10. Microfracture defects are detected by the addition of analysis circuit 40, which is connected in parallel to the original analysis circuit. The discharge-monitoring signal travels along path 17, as in surge tester 10, but follows an additional, parallel path to high-pass filter 31, which isolates response 25. Amplifier 32 can be utilized to amplify the signal, as shown in FIG. 9, and outputs it to rectifier 34. The signal is rectified by rectifier 34, as shown in FIG. 10, and passed to integrator 36 for integration. The integrated signal, as shown in FIG. 13, is passed to microprocessor 38, where, after going through A/D converter 41, a comparison is made between the integrated signal and one or more predetermined reference values by comparator 42 to determine the presence and extent of microfractures in wound coil 16.

Figure 14:
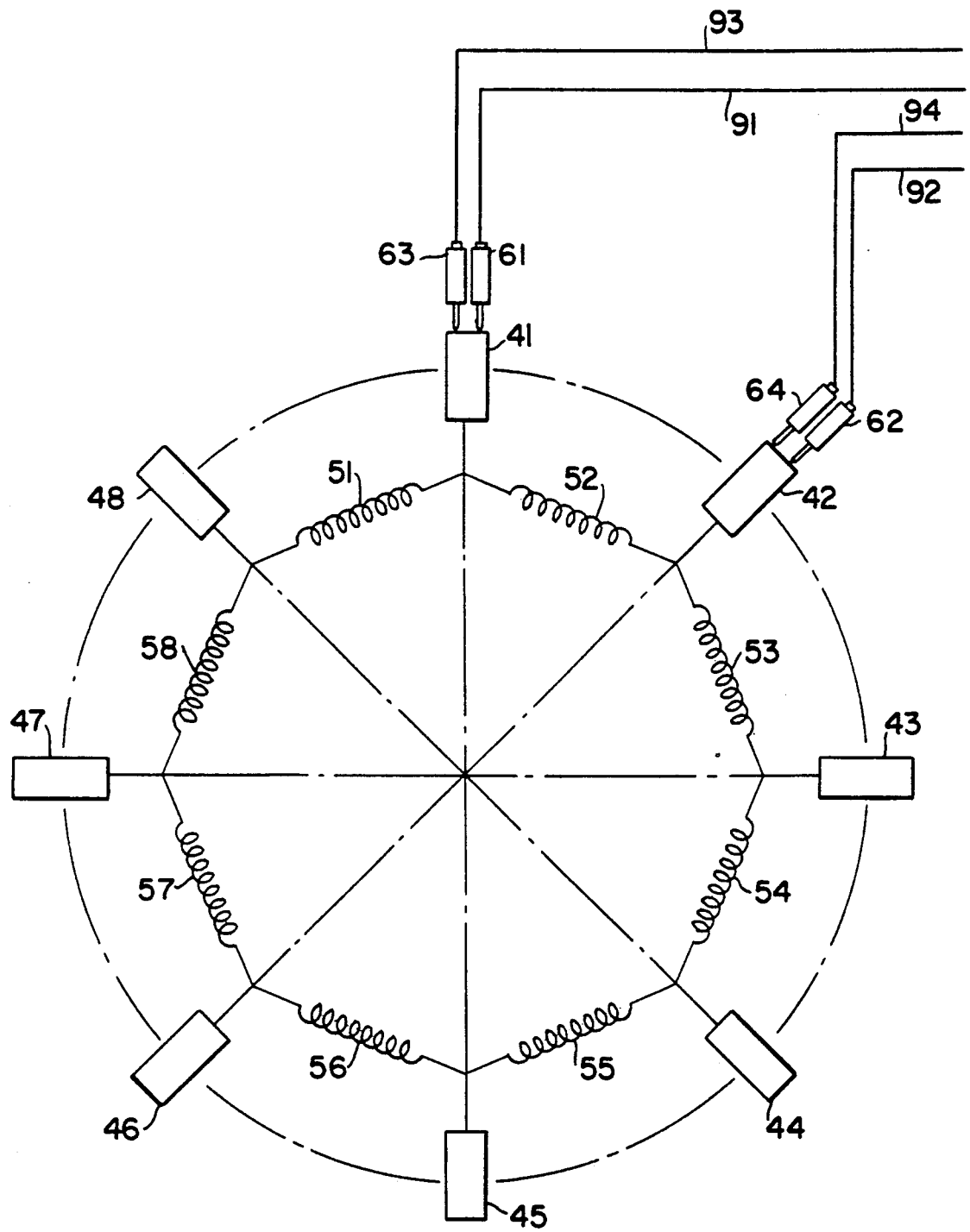
FIG. 14 is a schematic diagram of an electric motor armature to which contact probes are being applied from the of this invention.

FIG. 14 shows an illustrative example using the invention to test for defects in a wound armature having a commutator. In this example, the armature has eight coils 51–58, whereby each coil is terminated between two of commutator bars 41–48. Surge tester 30 has four lines 91, 92, 93, and 94, which are connected to four probes 61, 62, 63, and 64, which make contact with a pair of commutator bars for testing the coil connected between those bars. Probes 61 and 62 apply a potential across the coil being tested. Probes 63 and 64 are used to monitor the potential across the coil during discharge. After each coil is tested, the armature is angularly indexed to place the next coil in position in front of probes 61, 62, 63, and 64 for testing. This process is therefore very conducive to automated manufacturing.

Figure 15:
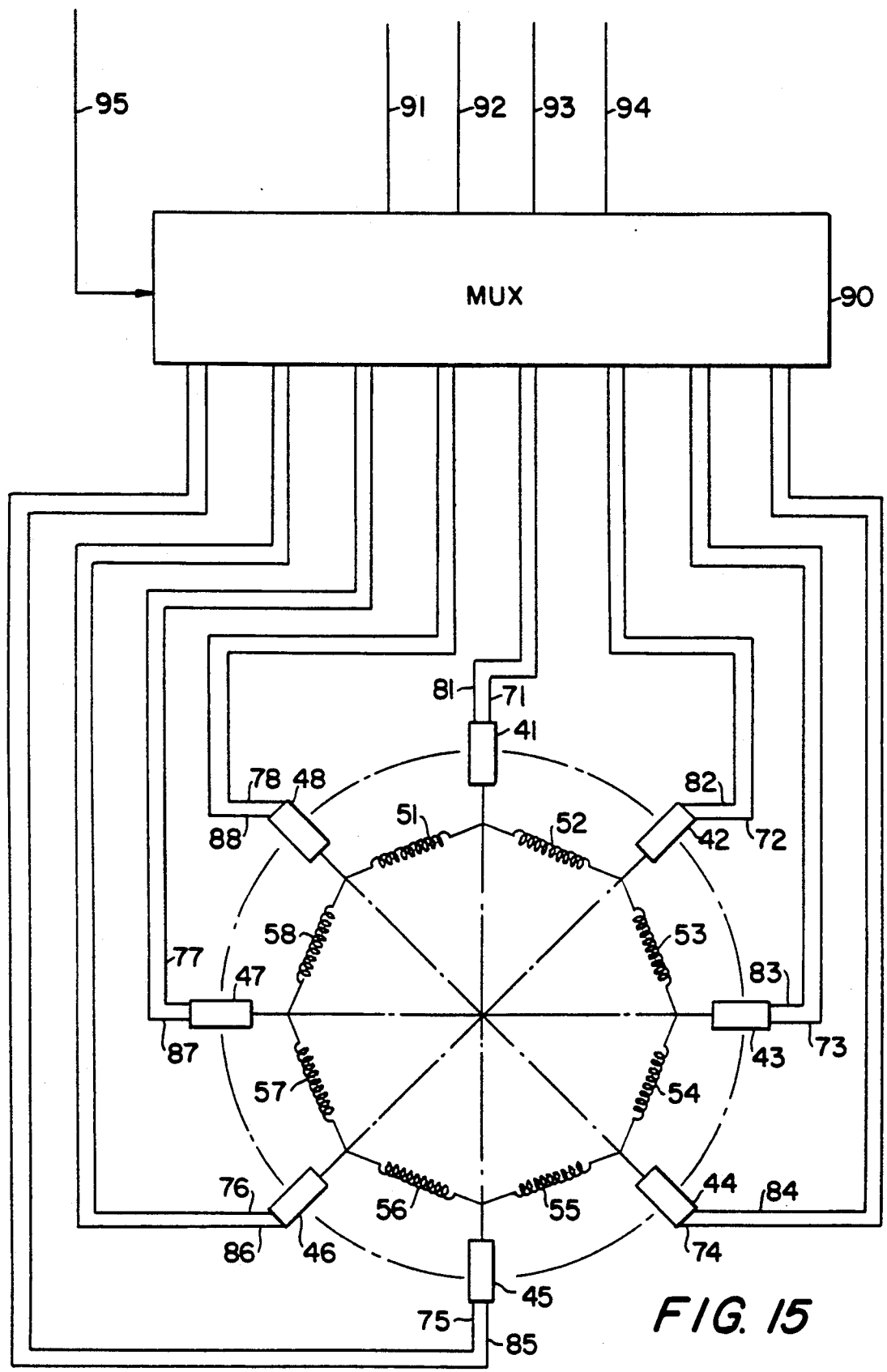
FIG. 15 is a schematic diagram of an electric motor armature to which contact probes are being applied in an alternate manner from the tester of this invention.

FIG. 15 shows an alternative illustrative embodiment using the invention to test for defects in a wound armature having a commutator. As in FIG. 14, the armature has eight coils 51–58, each coil being connected between two of commutator bars 41–48. In this example, eight pairs of probes 71,81–78,88 make contact with corresponding commutator bars 41–48. A charge potential is applied to each coil, in sequence, from lines 91 and 92 through multiplexer 90, via lines 71–78. The discharge potential is monitored via lines 81–88, through multiplexer 90 to lines 93 and 94. The sequencing of the applied and monitored signals is controlled by multiplexer 90 based upon control signals from microprocessor 38 (which is connected to multiplexer 90 via line 95). This process does not require indexing of the armature and is therefore also very conducive to automated manufacturing.

It will be understood that the foregoing is merely illustrative of the principles of this invention, and that various modifications can be made by those skilled in the art without departing from the scope and spirit of the invention. For example, a database can be established within microprocessor 38 containing different predetermined threshold limits for various devices, thereby simplifying the manufacturing and testing process for multiple devices.

I claim:

1. The method of detecting microfracture defects in the insulation of a wire which has been formed into a coil during manufacturing of a wound coil device comprising the steps of:

applying an electrical potential difference across said coil during said manufacturing of said wound coil device, said applied electrical potential difference having a relatively low frequency or oscillation and having a relatively higher than normal supply potential, thereby causing overstimulation of said coil;

detecting the potential at a predetermined point in said coil in response to said applied electrical potential difference.

producing a first signal indicative of said potential at said predetermined point; and analyzing said first signal to determine whether or not said first signal includes a component of at least a predetermined magnitude having a frequency which is substantially higher than said relatively low frequency in order to indicate that said insulation has microfracture defects if said first signal includes said component.

2. The method defined in claim 1 wherein said coil is connected in circuit relation with a capacitor so that said capacitor and said coil form an RLC circuit which is capable of oscillation, and wherein said step of applying an electrical potential difference across said coil comprises the step of:

causing said RLC circuit to oscillate.

3. The method defined in claim 2 wherein said RLC circuit oscillates at said relatively low frequency.

4. The method defined in claim 3 wherein said relatively low frequency is in the range from about 10 KHz to about 150 KHz.

5. The method defined in claim 1 wherein said step of detecting the potential at a predetermined point in said coil comprises the step of:

detecting the potential adjacent an end of said coil.

6. The method defined in claim 1 wherein said step of analyzing said first signal comprises the step of:

filtering said first signal to produce a second signal which includes only the portion of said first signal having frequencies substantially higher than said relatively low frequency.

7. The method defined in claim 6 wherein said frequencies substantially higher than said relatively low frequency are at least about 1 MHz.

8. The method defined in claim 6 wherein said step of analyzing said first signal further comprises the steps of:

rectifying said second signal to produce a third signal;
integrating said third signal to produce an integral value; and
comparing said integral value to a predetermined threshold value.

9. The method defined in claim 2 wherein said step of analyzing said first signal comprises the step of:

filtering said first signal to produce a second signal which includes only the portion of said first signal having frequencies substantially higher than said relatively low frequency.

10. The method defined in claim 9 wherein said frequencies substantially higher than said relatively low frequency are at least about 1 MHz.

11. The method defined in claim 9 wherein said step of analyzing said first signal further comprises the steps of:

rectifying said second signal to produce a third signal;
integrating said third signal to produce an integral value; and
comparing said integral value to a predetermined threshold value.

12. Apparatus for detecting microfracture defects in the insulation of a wire which has been formed into a coil during manufacturing of a wound coil device comprising:

means for applying an electrical potential difference across said coil during said manufacturing of said wound coil device, said applied electrical potential difference having at most a relatively low frequency of oscillation and having a relatively higher than normal supply potential, thereby causing overstimulation of said coil;

means for detecting the potential at a determined point in said coil in response to said applied electrical potential difference;

means responsive to said means for detecting for producing a first signal indicative of said potential at said predetermined point; and means for determining whether or not said first signal includes a component having a frequency which is substantially higher than said relatively low frequency in order to indicate that said insulation has microfracture defects if said first signal includes said component.

13. The apparatus defined in claim 12 wherein said means for applying comprises:

a capacitor connected in circuit relation with said coil so that said capacitor and said coil form an RLC circuit which is capable of oscillation; and
means for causing said RLC circuit to oscillate.

14. The apparatus defined in claim 13 wherein said RLC circuit oscillates at said relatively low frequency.

15. The apparatus defined in claim 14 wherein said relatively low frequency is in the range from about 10 KHz to about 150 KHz.

16. The apparatus defined in claim 12 wherein said means for detecting detects the potential adjacent an end of said coil.

17. The apparatus defined in claim 12 wherein said means for determining comprises:

means for filtering said first signal to produce a second signal which includes only the portion of said first signal having frequencies substantially higher than said relatively low frequency.

18. The apparatus defined in claim 17 wherein said frequencies substantially higher than said relatively low frequency are in the range from about 1 MHz to about 10 MHz.

19. The apparatus defined in claim 17 wherein said means for determining further comprises:

means for rectifying said second signal to produce a third signal;
means for integrating said third signal to produce an integral value; and
means for comparing said integral value to a predetermined threshold value.

* * * * *

UNITED STATES PATENT AND TRADEMARK OFFICE
CERTIFICATE OF CORRECTION

PATENT NO. : 5,256,977
DATED : October 26, 1993
INVENTOR(S) : Carlo Domenichini and Massimo Linari It is certified that error appears in the above-indentified patent and that said Letters Patent is hereby corrected as shown below:

| Column | Line | |
|---|---|---|
| 1 | 61 | "1" should be -- 2 --. |
| 2 | 31 | After "from the", insert -- tester --. |
| 4 | 52 | "I claim" should be -- The invention claimed is --. |
| 4 | 60 | "or" should be -- of --. |
| 4 | 66 | The period "." should be a semicolon -- ; --. |

Signed and Sealed this

Thirteenth Day of December, 1994

Attest:

BRUCE LEHMAN

Attesting Officer  Commissioner of Patents and Trademarks